(12) United States Patent
Verma et al.

(10) Patent No.: US 11,795,814 B2
(45) Date of Patent: Oct. 24, 2023

(54) EARLY WARNING AND AUTOMATED DETECTION FOR LOST CIRCULATION IN WELLBORE DRILLING

(71) Applicant: Landmark Graphics Corporation, Houston, TX (US)

(72) Inventors: Shashwat Verma, Bengaluru (IN); Sridharan Vallabhaneni, Bangalore (IN); Rune Hobberstad, Hundvag (NO); Samiran Roy, Bengaluru (IN)

(73) Assignee: Landmark Graphics Corporation, Houston, TX (US)

( * ) Notice: Subject to any disclaimer, the term of this patent is extended or adjusted under 35 U.S.C. 154(b) by 514 days.

(21) Appl. No.: 16/878,715

(22) Filed: May 20, 2020

(65) Prior Publication Data
US 2021/0285321 A1   Sep. 16, 2021

Related U.S. Application Data

(60) Provisional application No. 62/989,188, filed on Mar. 13, 2020.

(51) Int. Cl.
| | |
|---|---|
| *E21B 47/117* | (2012.01) |
| *G06N 20/00* | (2019.01) |
| *E21B 44/00* | (2006.01) |
| *G06F 30/27* | (2020.01) |
| *G06T 9/00* | (2006.01) |

(52) U.S. Cl.
CPC ............ *E21B 47/117* (2020.05); *E21B 44/00* (2013.01); *G06F 30/27* (2020.01); *G06N 20/00* (2019.01); *G06T 9/002* (2013.01); *E21B 2200/22* (2020.05); *G06T 2207/20084* (2013.01)

(58) Field of Classification Search
None
See application file for complete search history.

(56) References Cited

U.S. PATENT DOCUMENTS

| | | |
|---|---|---|
| 6,668,943 B1 | 12/2003 | Maus et al. |
| 2015/0218914 A1 | 8/2015 | Marx et al. |
| 2015/0300151 A1 | 10/2015 | Mohaghegh |
| (Continued) | | |

FOREIGN PATENT DOCUMENTS

| | | |
|---|---|---|
| CN | 101976494 | 6/2013 |
| CN | 102128022 | 6/2013 |
| (Continued) | | |

OTHER PUBLICATIONS

Application No. PCT/US2020/033690, International Search Report and Written Opinion, dated Dec. 4, 2020, 10 pages.
(Continued)

*Primary Examiner* — James A Thompson
(74) *Attorney, Agent, or Firm* — Kilpatrick Townsend & Stockton LLP

(57) ABSTRACT

A wellbore drilling system can generate a machine-learning model trained using historic drilling operation data for monitoring for a lost circulation event. Real-time data for a drilling operation can be received and the machine-learning model can be applied to the real-time data to identify a lost circulation event that is occurring. An alarm can then be outputted to indicate a lost circulation event is occurring for the drilling operation.

20 Claims, 7 Drawing Sheets

(56) References Cited

U.S. PATENT DOCUMENTS

| | | | |
|---|---|---|---|
| 2016/0053603 A1* | 2/2016 | Israel | E21B 45/00 |
| | | | 702/6 |
| 2017/0364795 A1 | 12/2017 | Anderson et al. | |
| 2018/0187498 A1 | 7/2018 | Sanchez Soto et al. | |
| 2018/0266233 A1* | 9/2018 | Ahmed | E21B 47/047 |
| 2019/0277135 A1 | 9/2019 | Zha | |
| 2021/0017853 A1* | 1/2021 | Iriarte Lopez | G06N 20/00 |
| 2021/0406792 A1* | 12/2021 | Bhardwaj | G06Q 10/067 |

FOREIGN PATENT DOCUMENTS

| | | |
|---|---|---|
| CN | 104806226 | 7/2015 |
| CN | 106150485 | 11/2016 |

OTHER PUBLICATIONS

NO Application No. NO20210175, Office Action, dated May 11, 2021, 6 pages.
Al-Hameedi, "Real-Time Lost Circulation Estimation and Mitigation", Egyptian Journal of Petroleum, vol. 27, 2018, pp. 1227-1234.
Fjetland et al., "Kick Detection and Influx Size Estimation during Offshore Drilling Operations using Deep Learning", Institute of Electrical and Electronics Engineers Conference On Industrial Electronics And Applications, Jun. 2019, pp. 2321-2326.
GB Application No. GB2101797.5, "Combined Search and Examination Report", dated Oct. 4, 2021, 9 pages.
NO. Application No. NO20210175, Office Action, dated Sep. 29, 2021, 3 pages.
Noshi et al., "The Role of Machine Learning in Drilling Operations: A Review", Society of Petroleum Engineers International, Oct. 2018, pp. 1-16.

* cited by examiner

EARLY WARNING AND AUTOMATED DETECTION FOR LOST CIRCULATION IN WELLBORE DRILLING

CROSS REFERENCE TO RELATED APPLICATION

This claims priority to U.S. Ser. No. 62/989,188, titled "Early Warning and Automated Detection for Lost Circulation in Wellbore Drilling" and filed Mar. 13, 2020, the entirety of which is incorporated herein by reference.

TECHNICAL FIELD

The present disclosure relates generally to wellbore drilling operations and, more particularly (although not necessarily exclusively), detecting and warning for a lost circulation event.

BACKGROUND

The hydrocarbon extraction industry makes use of wellbore drilling to explore and recover natural resources such as water, oil, and gas. During wellbore drilling, drilling fluid is pumped into the well to enable hydrocarbons to be released. The hydrocarbons, along with the drilling fluid, flow up the wellbore through a wellbore annulus to be extracted. Occasionally, drilling fluid can uncontrollably flow into a formation, reducing the amount of drilling fluid returning to the surface, meaning there is a loss of circulation. Lost circulation events are costly to drilling operations because remediation processes and nonproductive time are spent to repair the problem.

Identifying a lost circulation event can be difficult due to the large amount of data to be analyzed, among other factors. And, even if a lost circulation event is identified, it is usually identified much later than the beginning of the lost circulation event. Identifying a lost circulation event earlier can prevent the magnitude of lost drilling fluid.

DETAILED DESCRIPTION

Figure 1:
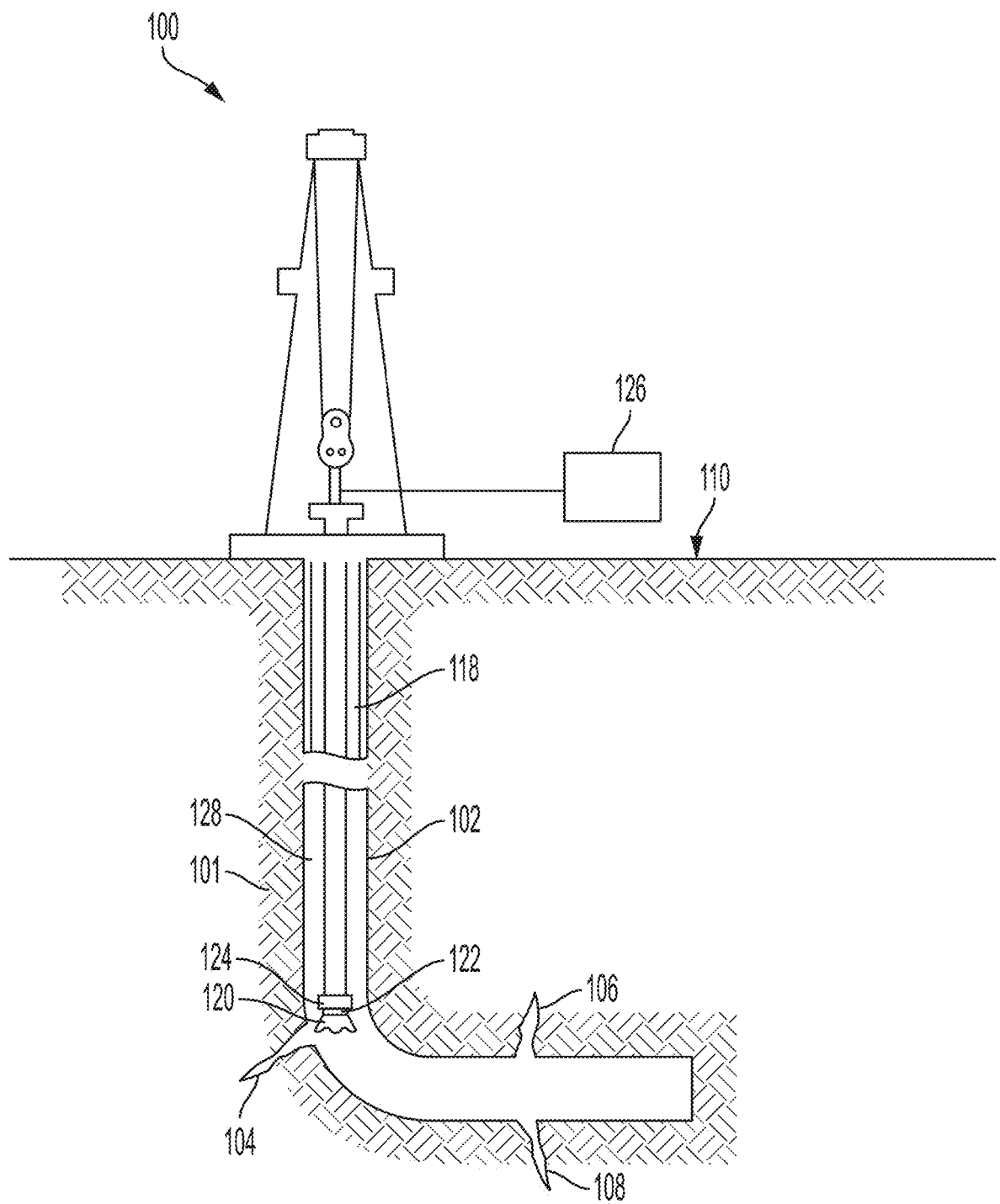
FIG. 1 is a schematic of a drilling rig and a system for drilling a wellbore and detecting a lost circulation event according to one example of the present disclosure.

Certain aspects and examples of the present disclosure relate to identifying a lost circulation event occurring and identifying the likelihood of a lost circulation event occurring in connection with a drilling operation by using a machine-learning process and monitoring real-time data in connection with the drilling operation. Lost circulation includes the loss to the formation being drilled of drilling fluids that are used in connection with the drilling operation. By using a system according to some examples, lost circulation events may be identified before the events actually occur, and the events may be mitigated or prevented to reduce nonproductive time and costs. And, damages to the drilling equipment from the lost circulation event can be prevented or mitigated.

Lost circulation can occur when drilling fluid such as mud flows uncontrollably into a formation that is being drilled. Types of lost circulation can depend on the amount of drilling fluid lost. Examples of types of lost circulation include seepage, partial loss, and total loss. Lost drilling fluid can be a significant problem in a drilling operation and can be caused by inherent fractures in the formation, improper drilling techniques, or excessive downhole pressures. Detecting lost circulation downhole can be challenging as it often involves interpreting drilling and formation data that lags behind a current drilling time. And, identifying the potential for lost circulation to enact preventive measures is not possible using current techniques.

In some examples, a system is provided that can identify the likelihood of lost circulation and output a notification to an operator. The system may learn patterns about lost circulation events, and identify associated precursors through a multi-step, semi-supervised learning pipeline. For example, the system can include a machine-learning subsystem that can be trained using historical data. Historical time-domain drilling data can be received by the system, along with petrophysical, pre-drill pressures, engineering or time-series based calculated variables, and geomechanical information. Examples of drilling data can include rate of penetration, weight on bit, standpipe pressure, depth, mud flow in, rotations per minute, torque, and equivalent circulation density. After training the system, the trained system can be used in connection with a drilling operation by receiving real-time drilling data and other parameters about the drilling operation. The system can output an early warning alarm in real time in response to detecting lost circulation precursors. And, a drilling operator can take preventive action in response to the alarm. If mud loss does occur, the system can use the data to update the model to improve detection. A system according to some examples can implement a data-centric approach that can be customized for each drilling operation based on the availability of historic data with parameters of the field being drilled.

Illustrative examples are given to introduce the reader to the general subject matter discussed herein and are not intended to limit the scope of the disclosed concepts. The following sections describe various additional features and examples with reference to the drawings in which like numerals indicate like elements, and directional descriptions are used to describe the illustrative aspects, but, like the illustrative aspects, should not be used to limit the present disclosure.

FIG. 1 is a schematic diagram of a drilling rig 100 for drilling a wellbore 102 into a subterranean formation 101 with fractures according to one example of the present disclosure. In this example, drilling rig 100 is depicted for a well, such as an oil or gas well, for extracting fluids from a subterranean formation 101. The drilling rig 100 may be used to create a wellbore 102 from a surface 110 of the subterranean formation 101. The drilling rig 100 includes a well tool or downhole tool 118, and a drill bit 120. The downhole tool 118 can be any tool used to gather information about the wellbore 102. For example, the downhole tool 118 can be a tool delivered downhole by wireline, often referred to as wireline formation testing ("WFT"). Alternatively, the downhole tool 118 can be a tool for either measuring-while-drilling or logging-while-drilling. The downhole tool 118 can include a sensor component 122 for determining information about the wellbore 102. Examples of information can include rate of penetration, weight on bit, standpipe pressure, depth, mud flow in, rotations per minute, torque, equivalent circulation density, or other parameters. The downhole tool 118 can also include a transmitter 124 for transmitting data from the sensor component 122 to the surface 110. The downhole tool 118 can further include the drill bit 120 for drilling the wellbore 102.

The wellbore 102 is shown as being drilled from the surface 110 and through the subterranean formation 101. As the wellbore 102 is drilled, drilling fluid can be pumped through the drill bit 120 and into the wellbore 102 to enhance drilling operations. As the drilling fluid enters into the wellbore, the drilling fluid circulates back toward the surface 110 through a wellbore annulus 128—the area between the drill bit 120 and the wellbore 102. A fracture, such as fractures 104, 106, or 108, in the subterranean formation 101 may cause a loss of drilling fluid leading to a loss of circulation of the drilling fluid. The fractures 104, 106, or 108 may be of natural origin or may be created during drilling operations. For example, fractures in the wellbore may be induced by increasing the pressure of the drilling fluid until the surrounding formation fails in tension and a fracture is induced.

Also included in the schematic diagram is a computing device 126. The computing device 126 can be communicatively coupled to the downhole tool 118 and receive real time information about the drilling process. The computing device 126 can include a machine-learning model that has been trained, and that can identify lost circulation and the potential for a lost circulation event and that can output an alarm to the drilling operator prior to the event occurring.

Figure 2:
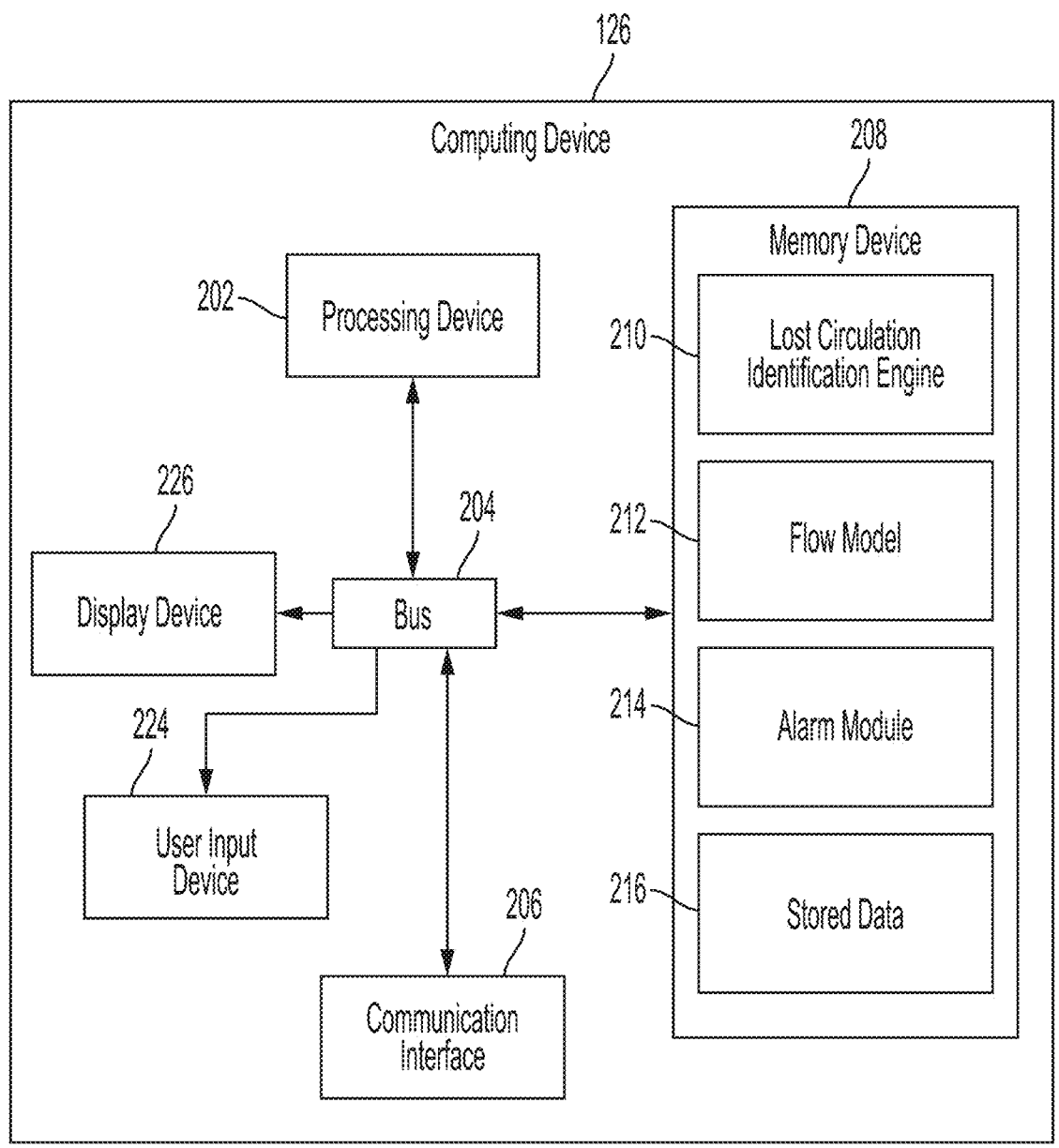
FIG. 2 is a block diagram of a computing system for detecting and warning for a lost circulation event according to one example of the present disclosure.

FIG. 2 is a block diagram of the computing device 126 for identifying the lost circulation events in a drilling operation according to some aspects of the present disclosure. The computing device 126 can include a processing device 202, a bus 204, a communication interface 206, a memory device 208, a user input device 224, and a display device 226. In some examples, the components shown in FIG. 2 can be integrated into a single structure. For example, the components can be within a single housing with a single processing device. In other examples, the components shown in FIG. 2 can be distributed (e.g., in separate housings) and in electrical communication with each other using various processors. It is also possible for the components to be distributed in a cloud computing system or grid computing system.

The processing device 202 can execute one or more operations for receiving information about a current wellbore drilling operation and executing a model for analyzing the information to determine the likelihood of a lost circulation event. The processing device 202 can execute instructions stored in the memory device 208 to perform the operations. The processing device 202 can include one processing device or multiple processing devices. Non-limiting examples of the processing device 202 include a field-programmable gate array ("FPGA"), an application-specific integrated circuit ("ASIC"), a processor, a microprocessor, etc.

The processing device 202 is communicatively coupled to the memory device 208 via the bus 204. The memory device 208 may include any type of memory device that retains stored information when powered off. Non-limiting examples of the memory device 208 include electrically erasable and programmable read-only memory ("EEPROM"), flash memory, or any other type of non-volatile memory. In some examples, at least some of the memory device 208 can include a non-transitory medium from which the processing device 202 can read instructions. A computer-readable medium can include electronic, optical, magnetic, or other storage devices capable of providing the processing device 202 with computer-readable instructions or other program code. Non-limiting examples of a computer-readable medium include (but are not limited to) magnetic disk(s), memory chip(s), read-only memory (ROM), random-access memory ("RAM"), an ASIC, a configured processing device, optical storage, or any other medium from which a computer processing device can read instructions. The instructions can include processing device-specific instructions generated by a compiler or an interpreter from code written in any suitable computer-programming language, including, for example, C, C++, C#, etc.

The communication interface 206 can represent one or more components that facilitate a network connection or otherwise facilitate communication between electronic devices. Examples include, but are not limited to, wired interfaces such as Ethernet, USB, IEEE 1394, or wireless interfaces such as IEEE 802.11, Bluetooth, near-field communication (NFC) interfaces, RFID interfaces, or radio interfaces for accessing cellular telephone networks (e.g., transceiver/antenna for accessing a CDMA, GSM, UMTS, or other mobile communications network). In some examples, the computing device 126 includes a user input device 224. The user input device 224 can represent one or more components used to input data. Examples of the user input device 224 can include a keyboard, mouse, touchpad, button, or touch-screen display, etc. In some examples, the computing device 126 includes a display device 226. The display device 226 can represent one or more components used to output data. Examples of the display device 226 can include a liquid-crystal display (LCD), a computer monitor, a touch-screen display, etc. In some examples, the user input device 224 and the display device 226 can be a single device, such as a touch-screen display.

In some examples, the memory device 208 can include instructions and data, such as a lost circulation identification engine 210, a flow model 212, an alarm module 214, and stored data 216. The lost circulation identification engine 210 can be computer program code instructions that are executable by the processing device 202 for applying the flow model 212 to real-time data received from a downhole tool via the communication interface 206. The flow model 212 may be a trained model that has been trained based on historic data associated with previous drilling operations, including operations that experienced a lost circulation event. Based on the analysis, the lost circulation identification engine 210 may be executed by the processing device 202 for implementing the alarm module 214 to cause an alarm to be outputted to the display device 226 or to another device that is operated by a drilling operator. The stored data 216 may include received real-time data about the drilling process and results from executing the flow model 212 on previous data for audit or other purposes.

The flow model 212 according to some examples can include two different models, or be capable of two different types of modeling. For example, the flow model 212 can be trained to determine whether a lost circulation event is occurring currently. And, the flow model 212 can be trained to determine whether the data indicates that a lost circulation event is about to occur.

Although FIG. 2 shows one computing device 126 for training and executing the flow model 212, other examples involve more than one computing device for training and executing a flow model according to various aspects. For example, one computing device may be used to train a flow model to determine whether a lost circulation event is occurring, that same computing device or another computing device may be used to train the flow model to determine whether data indicates that a lost circulation event is about to occur, and one or more other computing devices can be used to execute the trained model for any particular application. References herein to a (or the) "computing device," a (or the) "non-transitory computer-readable memory," a (or the) "processing device," or the like should be understood to refer to one or more computing devices, non-transitory computer-readable memories, processing devices, or similar components, including distributed devices that may each perform part of an operation.

Figure 3:
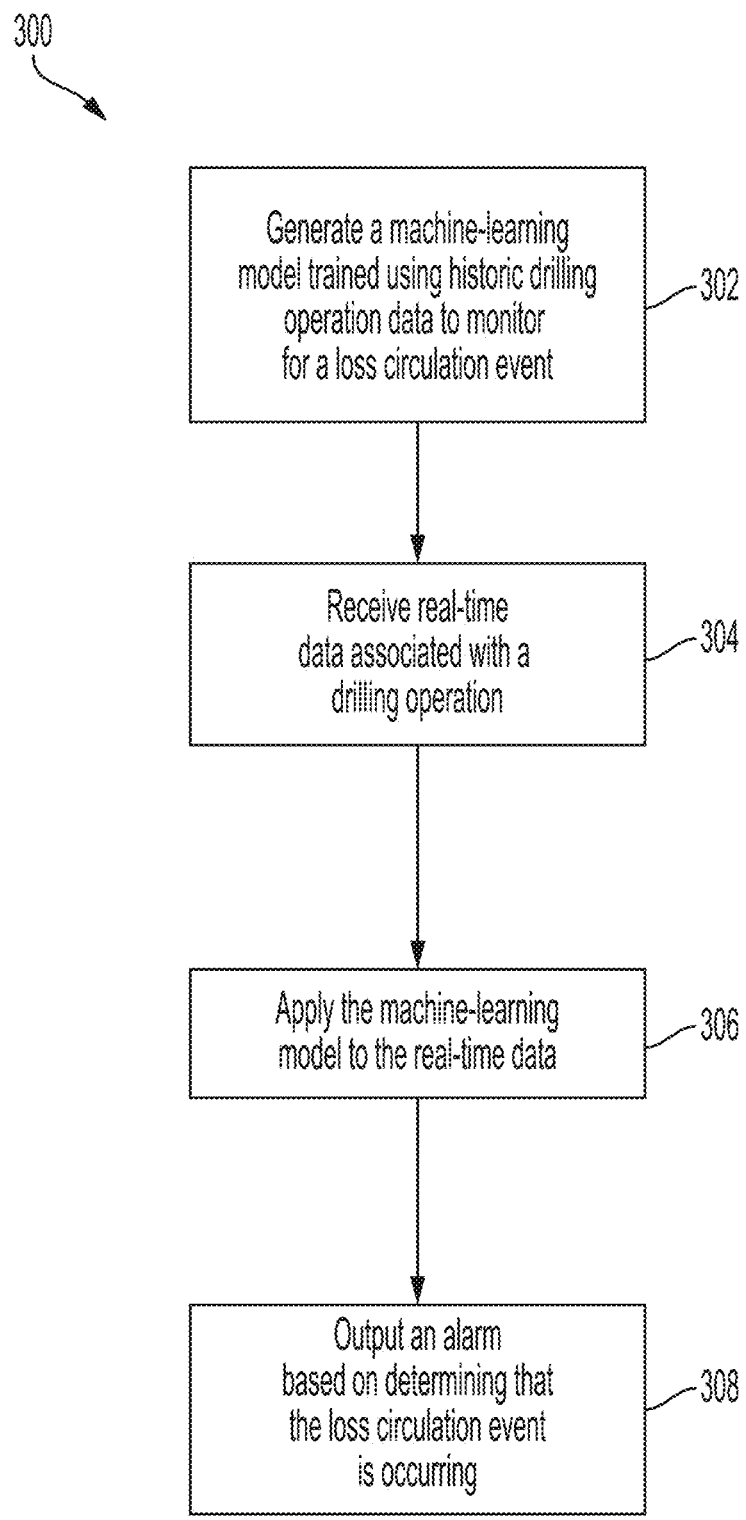
FIG. 3 is a flowchart of a process for detecting a lost circulation event currently occurring during a drilling operation according to one example of the present disclosure.

FIG. 3 is a flowchart of a process 300 for detecting a lost circulation event currently occurring according to one example of the present disclosure. In block 302, a machine-learning model is generated that can be trained using historical drilling operation data to monitor for a lost circulation event. Training the machine-learning model can involve removing or replacing outlier data and data unrelated to lost circulation events. The machine-learning model can be trained by spectral clustering based automated mud loss zone learning to identify when a lost circulation event is occurring. System testing may be performed for the generated machine-learning model using blind data and humans for randomized detection testing.

In block 304, real-time data associated with a drilling operation can be received. For example, a downhole tool can sense data about a drilling operation and communicate the data to a device, such as a computing device, at a surface of the wellbore via communication channels established with respect to the drilling operation. Examples of the real time data can include rate of penetration, weight on bit, standpipe pressure, drilling depth, mud flow in, rotations per minute, torque, and equivalent circulation density.

In block 306, the real-time data can be applied to the trained machine-learning model. The real-time data can be pre-processed by operations such as temporary caching, resampling and cleaning, feature selection and scaling, and outlier detection and removal prior to being applied to the trained machine-learning model. The machine-learning model can determine whether the data indicates that a lost circulation event is occurring for the drilling operation. In one example, the data can be received in data rows with each row corresponding to a time value and the model can determine that a lost circulation event is occurring after identifying indicators of a lost circulation event in a predetermined number of consecutive data rows.

In block 308 an alarm can be outputted based on a lost circulation event being detected by the model. The alarm can allow an operator to address the lost circulation event.

Figure 4:
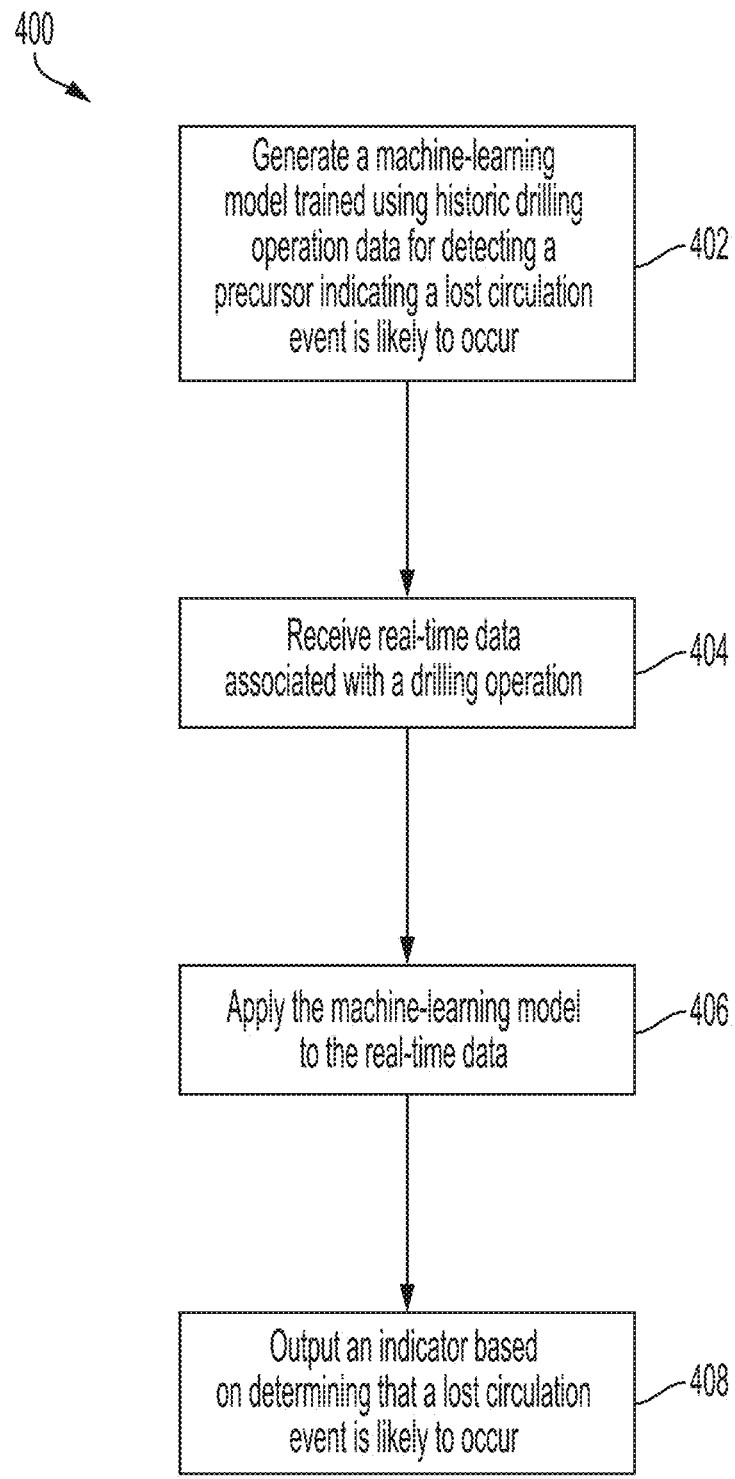
FIG. 4 is a flowchart of a process for outputting a warning for the likelihood that a lost circulation event will occur according to one example of the present disclosure.

FIG. 4 is a flowchart of a process 400 for warning about a likelihood that a lost circulation event will occur according to one example of the present disclosure. At block 402, a machine-learning model can be generated that is trained using historic drilling operation data for detecting a precursor indicating a lost circulation event is likely to occur. Outlier data and data unrelated to lost circulation events can be removed or replaced to create and train a usable model. The machine-learning model can be trained by spectral clustering based precursor learning for identifying precursors indicating a lost circulation event is likely to occur for the drilling operation. System testing may be performed for the machine-learning model using blind data and humans for early warning quality testing.

In block 404, real-time data associated with a drilling operation can be received. For example, a downhole tool can sense data about a drilling operation and communicate the data to a device, such as a computing device, at a surface of the wellbore via communication channels established with respect to the drilling operation. Examples of the real time data can include rate of penetration, weight on bit, standpipe pressure, drilling depth, mud flow in, rotations per minute, torque, and equivalent circulation density.

In block 406, the machine-learning model can be applied to the real-time data. The real-time data can go through pre-processing operations such as temporary caching, resampling and cleaning, feature selection and scaling, and outlier detection and removal prior to being applied to the trained machine-learning model. The machine-learning model can determine if a lost circulation event is likely to occur for the drilling operation. In one example, the real-time data can be checked for precursors above a pre-set threshold, indicating a lost circulation event is likely to occur for the drilling operation.

In block 408, an indicator can be outputted based on determining that a lost circulation event is likely to occur. The indicator can be outputs such as an early warning alarm or a user interface feature.

Figure 5:
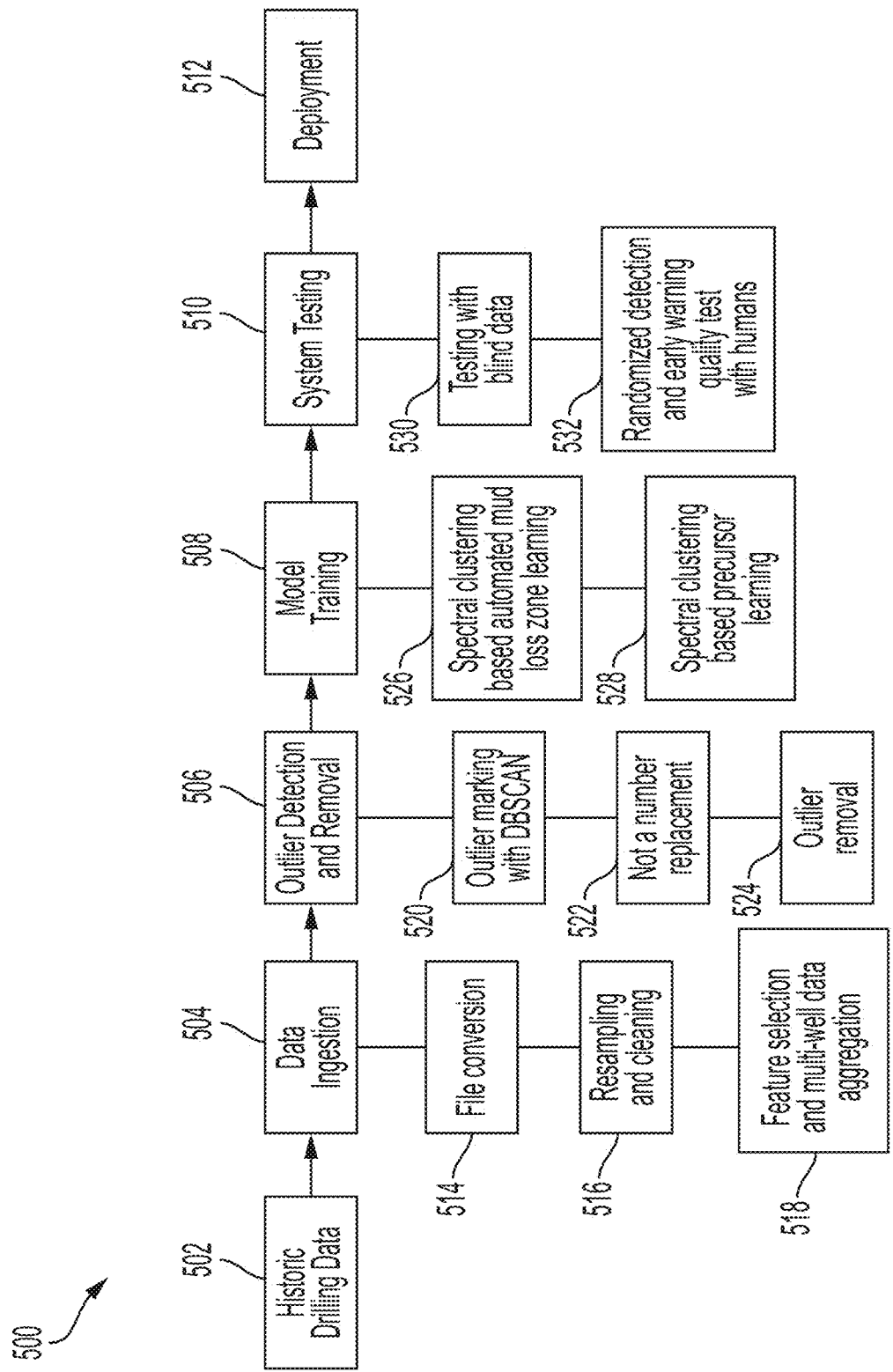
FIG. 5 is a flowchart of a process for creating and training a machine-learning model for detecting and predicting a lost circulation event according to one example of the present disclosure.

FIG. 5 is a flow diagram for a process 500 for training a lost circulation model according to one aspect of the present disclosure. Historic drilling data 502 can be received in a data ingestion process 504 that can pre-process the historic drilling data by file conversion 514, data resampling and cleaning 516, and a feature selection and multi-well data aggregation process 518. The feature selection and multi-well data aggregation process 518 may be performing a time series analysis on the historical drilling data. The ingested data then be processed in an outlier detection and removal process 506 to detect and remove outlying data so that usable models can be trained. The outlier detection and removal process 506 can include outlier marking based on density-based spatial clustering of applications with noise (DBSCAN) 520, not a number (NaN) replacement 522, and outlier removal 524. The density-based spatial clustering of applications with noise 520 can use a pre-set parameter to mark data values as outliers. Not a number replacement 522 can be done by taking an average of surrounding data values and replacing the not a number data values or marked outliers with the average data value.

The outlier removed data can be used in a model training process 508. The model training process 508 may be a semi-supervised learning process that uses unsupervised spectral clustering based automated mud loss zone warning 526 or unsupervised spectral clustering based precursor learning 528, which can then be used to train classifiers. For example, unlabeled drilling data can be segmented into different zones that can correspond to normal zones and lost circulation zones. The identification can occur in two steps: (1) segmenting between normal zone data and event data and (2) apply the clustering to the normal zone data and identify precursors across the aggregated dataset. The resulting dataset can be used to train supervised classifiers that can detect mud loss and the associated precursors. After a system testing process 510, the models can be deployed 512 for raising alarms and predicting lost circulation events based on incoming real-time drilling data. In some examples, the system testing process 510 can include testing using blind data 530 and randomized detection and early warning quality testing by users 532.

Figure 6:
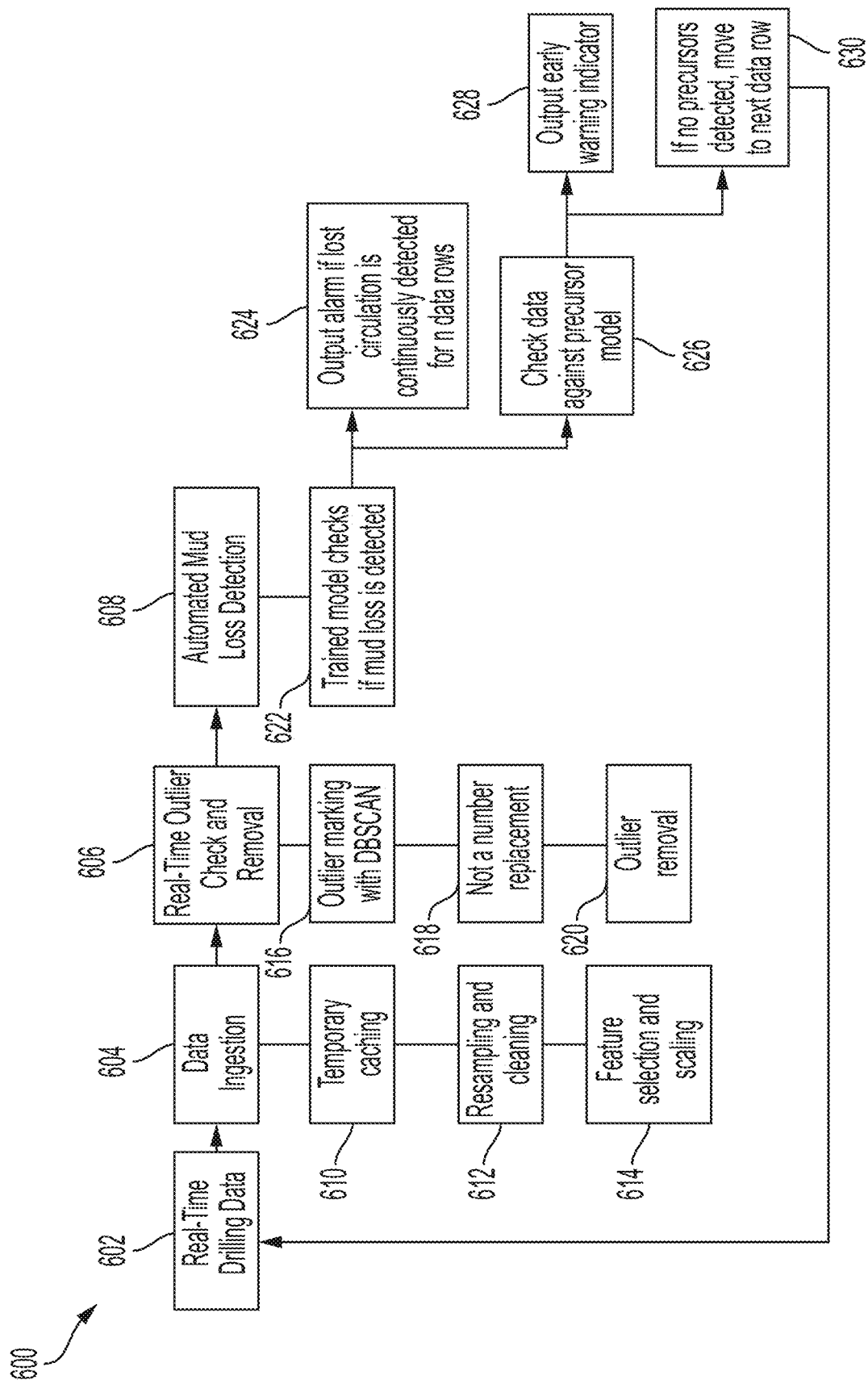
FIG. 6 is a flowchart of a process for deploying a trained machine-learning to detect and predict lost circulation events according to one example of the present disclosure.

FIG. 6 is a flow diagram for a process 600 for deploying a trained machine-learning to detect and predict lost circulation events according to various examples of the present disclosure. Real-time drilling data 602 can be received and undergo a data ingestion process 604. The data ingestion process 604 can pre-process the real-time drilling data 602 using operations such as temporary caching 610, resampling and cleaning 612, and feature selection and scaling 614 based on training parameters. The ingested data can also undergo a real-time outlier check process 606. For example, the real-time drilling data 602 can be processed using similar techniques and settings as in the model training phase, such as outlier marking with density-based spatial clustering of applications with noise (DBSCAN) 616, not a number replacement 618, and outlier removal 620, so that the real-time drilling data 602 is compatible with the trained models.

The pre-processed data can be used in an automated mud loss detection process 608. The automated mud loss detection process 608 may include applying a first model 622 to make a judgment if the data suggests that a lost circulation event has begun. If the detection is made continuously for a set amount of consecutive data rows, an alarm can be raised to alert the drilling operator 624. If the analysis on the data suggests a normal operation, the data can be passed to a second model 626 to identify early warning precursors in the data that may indicate that a lost circulation event is about to occur. The second model 626 may be more probabilistic than the first model 622 as it is predicting whether a lost circulation event is about to occur. If the signature is found to be above a pre-set threshold that may be based on the system training phase, an early warning indicator can be outputted 628 so that the drilling operator can determine the problem and take preventive issues. The system may provide some indications, such as by comparing the signature to historic precursors, as to why the alarm is raised. The system may use the incoming data to update its models so that the system can continuously improve the models. If no precursors are detected, the system moves to the next row of data 630.

Figure 7:
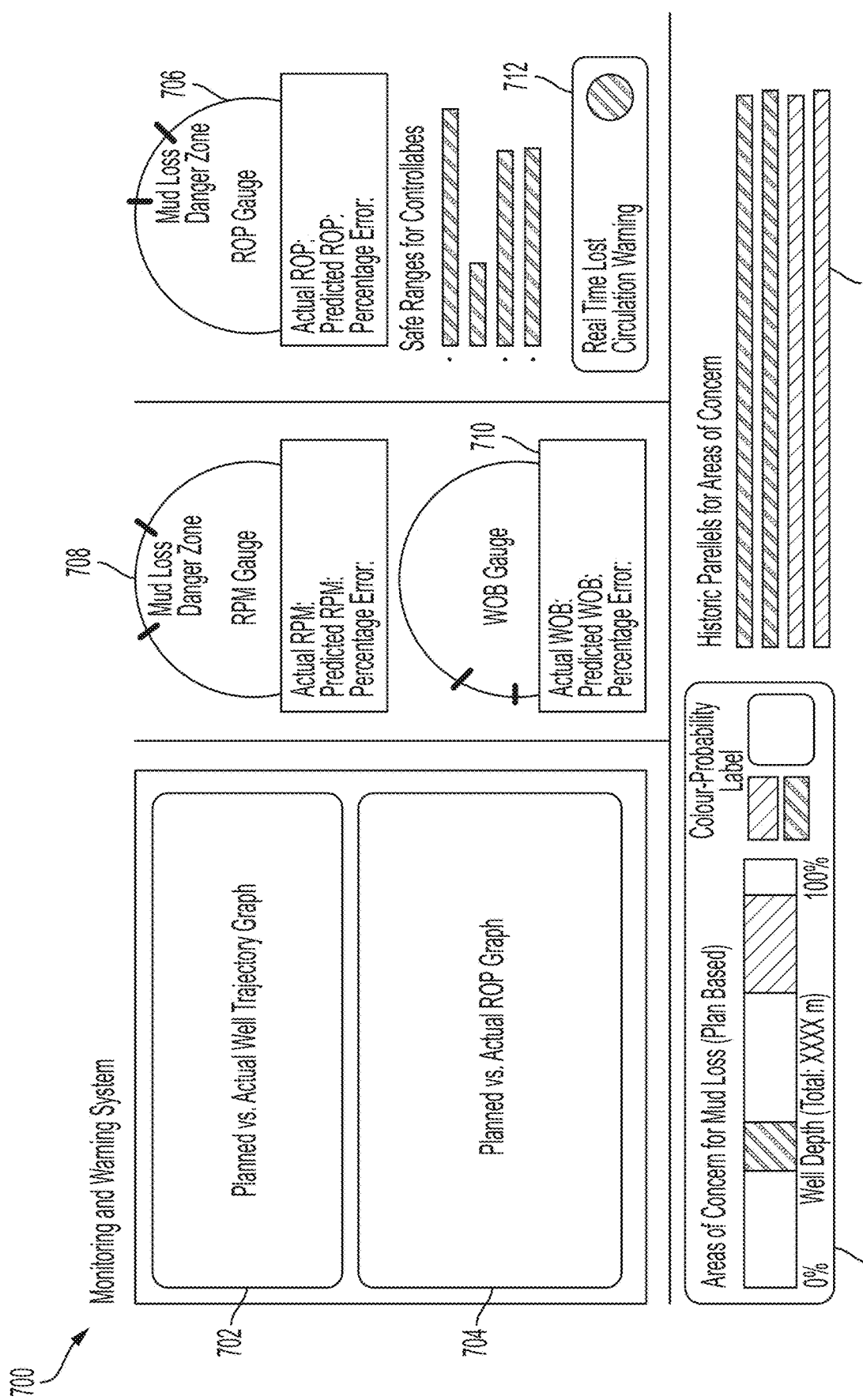
FIG. 7 is a user interface that may be outputted by a system for monitoring for lost circulation events and for providing an early warning of the likelihood of such events occurring according to one aspect of the present disclosure.

FIG. 7 is an example of a user interface 700 that may be outputted by a system for monitoring for lost circulation events and for providing an early warning of the likelihood of such events occurring according to one aspect of the present disclosure. The user interface can include a well trajectory graph 702, rate-of-penetration graph 704, a rate-of-penetration gauge 706, a rotations per minute gauge 708, and weight on bit data 710 to a user. The rate-of-penetration graph 704 can track information from the rate-of-penetration gauge 706 during a drilling operation. The user interface can also include a lost circulation warning feature 712, as well as a graph of areas of concern for mud loss 714 and historic parallel information about areas of concern 716.

The lost circulation warning feature 712 can be an alarm or light indicator that can be activated when the real-time data indicates a lost circulation event is occurring for a predetermined amount of consecutive data rows. The rate-of-penetration gauge 706 and the rotations per minute gauge 708 can have a mud loss danger zone indicator that can show a user when the real-time data coming in indicates there is a likelihood for mud loss. The historic parallel information about areas of concern 716 may be able to give some indication about why the alarm was raised by comparing the real-time data to historical data.

In some aspects, a system, a method, or a non-transitory computer-readable medium for detecting and warning for a lost circulation event are provided according to one or more of the following examples:

Example 1 is a system comprising: a processing device; and a memory device that includes instructions executable by the processing device for causing the processing device to: generate a machine-learning model trained using historic drilling operation data for monitoring for a lost circulation event; and receive real-time data associated with a drilling operation that is concurrently occurring with receiving the real-time data; apply the machine-learning model to the real-time data to identify any lost circulation event that is occurring for the drilling operation; and output an alarm based on determining that the lost circulation event is occurring for the drilling operation.

Example 2 is the system of example 1, wherein the memory device further includes instructions executable by the processing device for causing the processing device to generate the machine-learning model using the historic drilling operation data for detecting at least one precursor indicating a likelihood of the lost circulation event occurring, wherein the memory device further includes instructions executable by the processing device for causing the processing device to: apply the machine-learning model to the real-time data to detect the at least one precursor above a pre-set threshold indicating that the lost circulation event is likely to occur for the drilling operation; and output an indicator based on detecting the at least one precursor above the pre-set threshold.

Example 3 is system of example 2, wherein the indicator is an alarm or a user interface feature.

Example 4 is the system of examples 1-3, wherein the memory device further includes instructions executable by the processing device for causing the processing device to: pre-process the historic drilling operation data for training the machine-learning model by performing operations comprising: resampling and cleaning the historic drilling operation data to remove data that is unrelated to detecting the lost circulation event; performing a feature selection process on the historic drilling operation data using time series analysis; detecting and removing outlier data in the historic drilling operation data using density-based spatial clustering of applications with noise and a pre-set parameter for determining the outlier data; and at least one of: (i) removing the outlier data and data that is not a number or (ii) replacing, with an average of a plurality of data values that surround a data value to be replaced; and pre-process the real-time data prior to applying the real-time data to the machine-learning model by performing operations comprising: temporary caching to normalize the real-time data; resampling and cleaning the real-time data to remove data that is unrelated to detecting the lost circulation event; performing the feature selection process on the real-time data using time series analysis; detecting and removing outlier data in the real-time data using density-based spatial clustering of applications with noise and the pre-set parameter for determining the outlier data; and at least one of: (i) removing the outlier data and data that is not a number or (ii) replacing, with an average of a plurality of data values that surround a data value to be replaced.

Example 5 is the system of examples 1-4, wherein the memory device further includes instructions executable by the processing device for causing the processing device to generate the machine-learning model by performing operations comprising: training the machine-learning model using the historical drilling operation data and unsupervised spectral clustering for automated mud loss zone learning to enable the machine-learning model to segment the real-time data into a normal zone and a lost circulation zone, wherein the normal zone indicates the lost circulation event is not occurring and the lost circulation zone indicates the lost circulation event is occurring; and training the machine-learning model using the historic drilling operation data and unsupervised spectral clustering for precursor learning to enable the machine-learning model to detect the at least one precursor for the lost circulation event in the normal zone of the real-time data.

Example 6 is the system of examples 1-5, wherein the memory device includes instructions executable by the processing device for causing the processing device to apply the machine-learning model to the real-time data to identify any lost circulation event that is occurring for the drilling operation and apply the machine-learning model to detect the precursor above the pre-set threshold indicating that the lost circulation event is to occur for the drilling operation by performing operations comprising: determining whether the lost circulation event is occurring for the drilling operation; in response to determining that the lost circulation event is occurring, output the alarm representing that the lost circulation event is detected; in response to determining that the lost circulation event is not occurring, apply the machine-learning model to the real-time data to detect the precursor above the pre-set threshold indicating that the lost circulation event is to occur for the drilling operation; and in response to detecting the precursor above the pre-set threshold, output the indicator representing that the lost circulation event is to occur for the drilling operation.

Example 7 is the system of examples 1-6, wherein the memory device includes instructions executable by the processing device for causing the processing device to identify the lost circulation event is occurring for the drilling operation by performing operations comprising: receiving the real-time data in a plurality of consecutive rows with each of the plurality of consecutive rows having a set number of entries and the set number of entries correspond to a known time period; and detecting the real-time data is indicating the lost circulation event is occurring for a predetermined number of the plurality of consecutive rows.

Example 8 is a method, comprising: generating, by a computing device, a machine-learning model trained by using historic drilling operation data for detecting that a lost circulation event is occurring; receiving real-time data associated with a drilling operation that is concurrently occurring with receiving the real-time data; applying the machine-learning model to the real-time data to identify any lost circulation event that is occurring for the drilling operation; and outputting an alarm based on determining that the lost circulation event is occurring for the drilling operation.

Example 9 is the method of example 8, further comprising: generating, by a computing device, a machine-learning model trained by using historic drilling operation data for predicting that a lost circulation event is likely to occur; receiving real-time data associated with the drilling operation that is concurrently occurring with receiving the real-time data; applying the machine-learning model to the real-time data to detect a precursor above a pre-set threshold indicating that the lost circulation event is to occur for the drilling operation; and outputting an indicator based on detecting the precursor above the pre-set threshold.

Example 10 is the method of example 9, further comprising: pre-processing the historic drilling operation data for training the machine-learning model by performing operations comprising: resampling and cleaning the historic drilling operation data to remove data that is unrelated to detecting the lost circulation event; performing a feature selection process on the historic drilling operation data using time series analysis; detecting and removing outlier data in the historic drilling operation data using density-based spatial clustering of applications with noise and a pre-set parameter for determining the outlier data; and at least one of: (i) removing the outlier data and data that is not a number or (ii) replacing, with an average of a plurality of data values that surround a data value to be replaced; and pre-processing the real-time data prior to applying the real-time data to the machine-learning model by performing operations comprising: temporary caching to normalize the real-time data; resampling and cleaning the real-time data to remove data that is unrelated to detecting the lost circulation event; performing the feature selection process on the real-time data using time series analysis; detecting and removing outlier data in the real-time data using density-based spatial clustering of applications with noise and the pre-set parameter for determining the outlier data; and at least one of: (i) removing the outlier data and data that is not a number or (ii) replacing, with an average of a plurality of data values that surround a data value to be replaced.

Example 11 is the method of examples 8-10, wherein generating the machine-learning model comprises: training the machine-learning model using the historical drilling operation data and unsupervised spectral clustering for automated mud loss zone learning to enable the machine-learning model to segment the real-time data into a normal zone and a lost circulation zone, wherein the normal zone indicates the lost circulation event is not occurring and the lost circulation zone indicates the lost circulation event is occurring; and training the machine-learning model using the historic drilling operation data and unsupervised spectral clustering for precursor learning to enable the machine-learning model to detect the at least one precursor for the lost circulation event in the normal zone of the real-time data.

Example 12 is the method of examples 8-11, wherein applying the machine-learning model to the real-time data to identify any lost circulation event that is occurring for the drilling operation and applying the machine-learning model to detect the precursor above the pre-set threshold indicating that the lost circulation event is to occur for the drilling operation comprises: determining whether the lost circulation event is occurring for the drilling operation; in response to determining that the lost circulation event is occurring, outputting the alarm representing that the lost circulation event is detected; in response to determining that the lost circulation event is not occurring, applying the machine-learning model to the real-time data to detect the precursor above the pre-set threshold indicating that the lost circulation event is to occur for the drilling operation; and in response to detecting the precursor above the pre-set threshold, outputting the indicator representing that the lost circulation event is to occur for the drilling operation.

Example 13 is the method of examples 8-12, wherein identifying the lost circulation event is occurring for the drilling operation comprises: receiving the real-time data in a plurality of consecutive rows with each of the plurality of consecutive rows having a set number of entries and the set number of entries correspond to a known time period; and detecting the real-time data is indicating the lost circulation event is occurring for a predetermined number of the plurality of consecutive rows.

Example 14 is a non-transitory computer-readable medium comprising instructions that are executable by a processing device for causing the processing device to perform operations comprising: generating a machine-learning model trained by using historic drilling operation data for detecting that a lost circulation event is occurring; receiving real-time data associated with a drilling operation that is concurrently occurring with receiving the real-time data; applying the machine-learning model to the real-time data to identify any lost circulation event that is occurring for the drilling operation; and outputting an alarm based on determining that the lost circulation event is occurring for the drilling operation.

Example 15 is the non-transitory computer-readable medium of example 14, further comprising instructions executable by the processing device for causing the processing device to generate the machine-learning model using the historic drilling operation data for detecting at least one precursor indicating a likelihood of the lost circulation event occurring, wherein the non-transitory computer-readable medium further includes instructions executable by the processing device for causing the processing device to: apply the machine-learning model to the real-time data to detect the at least one precursor above a pre-set threshold indicating that the lost circulation event is likely to occur for the drilling operation; and output an indicator based on detecting the at least one precursor above the pre-set threshold.

Example 16 is the non-transitory computer-readable medium of example 15, wherein the indicator is an alarm or a user interface feature.

Example 17 is the non-transitory computer-readable medium of examples 14-16, further comprising instructions executable by the processing device for causing the processing device to: pre-process the historic drilling operation data for training the machine-learning model by performing operations comprising: resampling and cleaning the historic drilling operation data to remove data that is unrelated to detecting the lost circulation event; performing a feature selection process on the historic drilling operation data using time series analysis; detecting and removing outlier data in the historic drilling operation data using density-based spatial clustering of applications with noise and a pre-set parameter for determining the outlier data; and at least one of: (i) removing the outlier data and data that is not a number or (ii) replacing, with an average of a plurality of data values that surround a data value to be replaced; and pre-process the real-time data prior to applying the real-time data to the machine-learning model by performing operations comprising: temporary caching to normalize the real-time data; resampling and cleaning the real-time data to remove data that is unrelated to detecting the lost circulation event; performing the feature selection process on the real-time data using time series analysis; detecting and removing outlier data in the real-time data using density-based spatial clustering of applications with noise and the pre-set parameter for determining the outlier data; and at least one of: (i) removing the outlier data and data that is not a number or (ii) replacing, with an average of a plurality of data values that surround a data value to be replaced.

Example 18 is the non-transitory computer-readable medium of examples 14-17, further comprising instructions executable by the processing device for causing the processing device to generate the machine-learning model by performing operations comprising: training the machine-learning model using the historical drilling operation data and unsupervised spectral clustering for automated mud loss zone learning to enable the machine-learning model to segment the real-time data into a normal zone and a lost circulation zone, wherein the normal zone indicates the lost circulation event is not occurring and the lost circulation zone indicates the lost circulation event is occurring; and training the machine-learning model using the historic drilling operation data and unsupervised spectral clustering for precursor learning to enable the machine-learning model to detect the at least one precursor for the lost circulation event in the normal zone of the real-time data.

Example 19 is the non-transitory computer-readable medium of examples 14-18, further comprising instructions executable by the processing device for causing the processing device to apply the machine-learning model to the real-time data to identify any lost circulation event that is occurring for the drilling operation and apply the machine-learning model to detect the precursor above the pre-set threshold indicating that the lost circulation event is to occur for the drilling operation by performing operations comprising: determining whether the lost circulation event is occurring for the drilling operation; in response to determining that the lost circulation event is occurring, output the alarm representing that the lost circulation event is detected; in response to determining that the lost circulation event is not occurring, apply the machine-learning model to the real-time data to detect the precursor above the pre-set threshold indicating that the lost circulation event is to occur for the drilling operation; and in response to detecting the precursor above the pre-set threshold, output the indicator representing that the lost circulation event is to occur for the drilling operation.

Example 20 is the non-transitory computer-readable medium of examples 14-19, further comprising instructions executable by the processing device for causing the processing device to identify the lost circulation event is occurring for the drilling operation by performing operations comprising: receiving the real-time data in a plurality of consecutive rows with each of the plurality of consecutive rows having a set number of entries and the set number of entries correspond to a known time period; and detecting the real-time data is indicating the lost circulation event is occurring for a predetermined number of the plurality of consecutive rows.

The foregoing description of certain examples, including illustrated examples, has been presented only for the purpose of illustration and description and is not intended to be exhaustive or to limit the disclosure to the precise forms disclosed. Numerous modifications, adaptations, and uses thereof will be apparent to those skilled in the art without departing from the scope of the disclosure.

What is claimed is:

1. A system comprising:
a processing device; and
a memory device that includes instructions executable by the processing device for causing the processing device to:
generate a first machine-learning model trained using historic drilling operation data for monitoring for a lost circulation event; and
receive real-time data associated with a drilling operation that is concurrently occurring with receiving the real-time data;
apply the first machine-learning model to the real-time data to identify a lost circulation event that is occurring for a predetermined period of time for the drilling operation; and display, via a user interface and based on determining that the lost circulation event is occurring for the predetermined period of time for the drilling operation, a user interface feature indicating the lost circulation event, wherein the user interface further comprises a mud loss indicator.

2. The system of claim 1, wherein the memory device further includes instructions executable by the processing device for causing the processing device to:
generate a second machine-learning model using the historic drilling operation data for detecting at least one precursor indicating a likelihood of the lost circulation event occurring;
apply the second machine-learning model to the real-time data to detect the at least one precursor above a pre-set threshold indicating that the lost circulation event is likely to occur for the drilling operation; and
output an indicator based on detecting the at least one precursor above the pre-set threshold.

3. The system of claim 2, wherein the indicator is an alarm or the user interface feature.

4. The system of claim 1, wherein the memory device further includes instructions executable by the processing device for causing the processing device to:
pre-process the historic drilling operation data for training the first machine-learning model by performing operations comprising:
resampling and cleaning the historic drilling operation data to remove data that is unrelated to detecting the lost circulation event;
performing a feature selection process on the historic drilling operation data using time series analysis;
detecting and removing outlier data in the historic drilling operation data using density-based spatial clustering of applications with noise and a pre-set parameter for determining the outlier data; and
at least one of: (i) removing the outlier data and data that is not a number or (ii) replacing, with an average of a plurality of data values that surround a data value to be replaced; and
pre-process the real-time data prior to applying the real-time data to the first machine-learning model by performing operations comprising:
temporary caching to normalize the real-time data;
resampling and cleaning the real-time data to remove data that is unrelated to detecting the lost circulation event;
performing the feature selection process on the real-time data using time series analysis;
detecting and removing outlier data in the real-time data using density-based spatial clustering of applications with noise and the pre-set parameter for determining the outlier data; and
at least one of: (i) removing the outlier data and data that is not a number or (ii) replacing, with an average of a plurality of data values that surround a data value to be replaced.

5. The system of claim 2, wherein the memory device further includes instructions executable by the processing device for causing the processing device to:
train the first machine-learning model using the historical drilling operation data and unsupervised spectral clustering for automated mud loss zone learning to enable the first machine-learning model to segment the real-time data into a normal zone and a lost circulation zone, wherein the normal zone indicates the lost circulation event is not occurring and the lost circulation zone indicates the lost circulation event is occurring; and
train the second machine-learning model using the historic drilling operation data and unsupervised spectral clustering for precursor learning to enable the second machine-learning model to detect the at least one precursor for the lost circulation event in the normal zone of the real-time data.

6. The system of claim 2, wherein the memory device includes instructions executable by the processing device for causing the processing device to apply the first machine-learning model to the real-time data to identify any lost circulation event that is occurring for the drilling operation and apply the second machine-learning model to detect the precursor above the pre-set threshold indicating that the lost circulation event is to occur for the drilling operation by performing operations comprising:
determining whether the lost circulation event is occurring for the drilling operation;
in response to determining that the lost circulation event is occurring, output the alarm representing that the lost circulation event is detected;
in response to determining that the lost circulation event is not occurring, apply the second machine-learning model to the real-time data to detect the precursor above the pre-set threshold indicating that the lost circulation event is to occur for the drilling operation; and
in response to detecting the precursor above the pre-set threshold, output the indicator representing that the lost circulation event is to occur for the drilling operation.

7. The system of claim 1, wherein the memory device includes instructions executable by the processing device for causing the processing device to identify the lost circulation event is occurring for the drilling operation by performing operations comprising:
receiving the real-time data in a plurality of consecutive rows with each of the plurality of consecutive rows having a set number of entries and the set number of entries correspond to a known time period; and
detecting the real-time data is indicating the lost circulation event is occurring for a predetermined number of the plurality of consecutive rows.

8. A method, comprising:
generating, by a computing device, a first machine-learning model trained by using historic drilling operation data for detecting that a lost circulation event is occurring;
receiving real-time data associated with a drilling operation that is concurrently occurring with receiving the real-time data;
applying the first machine-learning model to the real-time data to identify a lost circulation event that is occurring for a predetermined period of time for the drilling operation; and
displaying, via a user interface and based on determining that the lost circulation event is occurring for the predetermined period of time for the drilling operation, a user interface feature indicating the lost circulation event, wherein the user interface further comprises a mud loss indicator.

9. The method of claim 8, further comprising:
generating, by a computing device, a second machine-learning model trained by using historic drilling operation data for predicting that a lost circulation event is likely to occur;

receiving real-time data associated with the drilling operation that is concurrently occurring with receiving the real-time data;

applying the second machine-learning model to the real-time data to detect a precursor above a pre-set threshold indicating that the lost circulation event is to occur for the drilling operation; and outputting an indicator based on detecting the precursor above the pre-set threshold.

10. The method of claim 8, further comprising:

pre-processing the historic drilling operation data for training the first machine-learning model by performing operations comprising:

resampling and cleaning the historic drilling operation data to remove data that is unrelated to detecting the lost circulation event;

performing a feature selection process on the historic drilling operation data using time series analysis;

detecting and removing outlier data in the historic drilling operation data using density-based spatial clustering of applications with noise and a pre-set parameter for determining the outlier data; and at least one of: (i) removing the outlier data and data that is not a number or (ii) replacing, with an average of a plurality of data values that surround a data value to be replaced; and pre-processing the real-time data prior to applying the real-time data to the first machine-learning model by performing operations comprising:

temporary caching to normalize the real-time data;

resampling and cleaning the real-time data to remove data that is unrelated to detecting the lost circulation event;

performing the feature selection process on the real-time data using time series analysis;

detecting and removing outlier data in the real-time data using density-based spatial clustering of applications with noise and the pre-set parameter for determining the outlier data; and at least one of: (i) removing the outlier data and data that is not a number or (ii) replacing, with an average of a plurality of data values that surround a data value to be replaced.

11. The method of claim 9, further comprising:

training the first machine-learning model using the historical drilling operation data and unsupervised spectral clustering for automated mud loss zone learning to enable the first machine-learning model to segment the real-time data into a normal zone and a lost circulation zone, wherein the normal zone indicates the lost circulation event is not occurring and the lost circulation zone indicates the lost circulation event is occurring; and training the second machine-learning model using the historic drilling operation data and unsupervised spectral clustering for precursor learning to enable the second machine-learning model to detect the at least one precursor for the lost circulation event in the normal zone of the real-time data.

12. The method of claim 9, wherein applying the first machine-learning model to the real-time data to identify any lost circulation event that is occurring for the drilling operation and applying the second machine-learning model to detect the precursor above the pre-set threshold indicating that the lost circulation event is to occur for the drilling operation comprises:

determining whether the lost circulation event is occurring for the drilling operation;

in response to determining that the lost circulation event is occurring, outputting the alarm representing that the lost circulation event is detected;

in response to determining that the lost circulation event is not occurring, applying the second machine-learning model to the real-time data to detect the precursor above the pre-set threshold indicating that the lost circulation event is to occur for the drilling operation; and in response to detecting the precursor above the pre-set threshold, outputting the indicator representing that the lost circulation event is to occur for the drilling operation.

13. The method of claim 8, wherein identifying the lost circulation event is occurring for the drilling operation comprises:

receiving the real-time data in a plurality of consecutive rows with each of the plurality of consecutive rows having a set number of entries and the set number of entries correspond to a known time period; and detecting the real-time data is indicating the lost circulation event is occurring for a predetermined number of the plurality of consecutive rows.

14. A non-transitory computer-readable medium comprising instructions that are executable by a processing device for causing the processing device to perform operations comprising:

generating a first machine-learning model trained by using historic drilling operation data for detecting that a lost circulation event is occurring;

receiving real-time data associated with a drilling operation that is concurrently occurring with receiving the real-time data;

applying the first machine-learning model to the real-time data to identify a lost circulation event that is occurring for a predetermined period of time for the drilling operation; and displaying, via a user interface and based on determining that the lost circulation event is occurring for the predetermined period of time for the drilling operation, a user interface feature indicating the lost circulation event, wherein the user interface further comprises a mud loss indicator.

15. The non-transitory computer-readable medium of claim 14, further comprising instructions executable by the processing device for causing the processing device to:

generate a second machine-learning model using the historic drilling operation data for detecting at least one precursor indicating a likelihood of the lost circulation event occurring;

apply the second machine-learning model to the real-time data to detect the at least one precursor above a pre-set threshold indicating that the lost circulation event is likely to occur for the drilling operation; and output an indicator based on detecting the at least one precursor above the pre-set threshold.

16. The non-transitory computer-readable medium of claim 15, wherein the indicator is an alarm or the user interface feature.

17. The non-transitory computer-readable medium of claim 14, further comprising instructions executable by the processing device for causing the processing device to:

pre-process the historic drilling operation data for training the first machine-learning model by performing operations comprising:

resampling and cleaning the historic drilling operation data to remove data that is unrelated to detecting the lost circulation event;

performing a feature selection process on the historic drilling operation data using time series analysis;

detecting and removing outlier data in the historic drilling operation data using density-based spatial clustering of applications with noise and a pre-set parameter for determining the outlier data; and at least one of: (i) removing the outlier data and data that is not a number or (ii) replacing, with an average of a plurality of data values that surround a data value to be replaced; and pre-process the real-time data prior to applying the real-time data to the first machine-learning model by performing operations comprising:

temporary caching to normalize the real-time data;

resampling and cleaning the real-time data to remove data that is unrelated to detecting the lost circulation event;

performing the feature selection process on the real-time data using time series analysis;

detecting and removing outlier data in the real-time data using density-based spatial clustering of applications with noise and the pre-set parameter for determining the outlier data; and at least one of: (i) removing the outlier data and data that is not a number or (ii) replacing, with an average of a plurality of data values that surround a data value to be replaced.

18. The non-transitory computer-readable medium of claim 15, further comprising instructions executable by the processing device for causing the processing device to:

train the first machine-learning model using the historical drilling operation data and unsupervised spectral clustering for automated mud loss zone learning to enable the first machine-learning model to segment the real-time data into a normal zone and a lost circulation zone, wherein the normal zone indicates the lost circulation event is not occurring and the lost circulation zone indicates the lost circulation event is occurring; and train the second machine-learning model using the historic drilling operation data and unsupervised spectral clustering for precursor learning to enable the second machine-learning model to detect the at least one precursor for the lost circulation event in the normal zone of the real-time data.

19. The non-transitory computer-readable medium of claim 15, further comprising instructions executable by the processing device for causing the processing device to apply the first machine-learning model to the real-time data to identify any lost circulation event that is occurring for the drilling operation and apply the second machine-learning model to detect the precursor above the pre-set threshold indicating that the lost circulation event is to occur for the drilling operation by performing operations comprising:

determining whether the lost circulation event is occurring for the drilling operation;

in response to determining that the lost circulation event is occurring, output the alarm representing that the lost circulation event is detected;

in response to determining that the lost circulation event is not occurring, apply the second machine-learning model to the real-time data to detect the precursor above the pre-set threshold indicating that the lost circulation event is to occur for the drilling operation; and in response to detecting the precursor above the pre-set threshold, output the indicator representing that the lost circulation event is to occur for the drilling operation.

20. The non-transitory computer-readable medium of claim 14, further comprising instructions executable by the processing device for causing the processing device to identify the lost circulation event is occurring for the drilling operation by performing operations comprising:

receiving the real-time data in a plurality of consecutive rows with each of the plurality of consecutive rows having a set number of entries and the set number of entries correspond to a known time period; and detecting the real-time data is indicating the lost circulation event is occurring for a predetermined number of the plurality of consecutive rows.

* * * * *